United States Patent [19]
Pfiester et al.

[11] Patent Number: 4,948,745
[45] Date of Patent: Aug. 14, 1990

[54] PROCESS FOR ELEVATED SOURCE/DRAIN FIELD EFFECT STRUCTURE

[75] Inventors: James R. Pfiester; Richard D. Sivan, both of Austin, Tex.

[73] Assignee: Motorola, Inc., Schaumburg, Ill.

[21] Appl. No.: 353,933

[22] Filed: May 22, 1989

[51] Int. Cl.$^5$ .......................................... H01L 21/336
[52] U.S. Cl. ........................................ 437/41; 437/44; 437/46; 437/56; 437/57; 437/89; 437/99; 437/191; 437/233
[58] Field of Search ....................... 437/29, 40, 41, 46, 437/57, 56, 89, 99, 186, 191, 195, 228, 233

[56] References Cited

U.S. PATENT DOCUMENTS

| | | | |
|---|---|---|---|
| 3,912,557 | 10/1975 | Hochberg | 437/89 |
| 4,282,648 | 8/1981 | Yu et al. | 437/162 |
| 4,341,009 | 7/1982 | Bartholomew | 437/162 |
| 4,359,816 | 11/1982 | Abbas et al. | 437/41 |
| 4,433,468 | 2/1984 | Kawamata | 437/193 |
| 4,471,522 | 9/1984 | Jambotkar | 437/162 |
| 4,521,448 | 6/1985 | Sasaki | 437/41 |
| 4,577,392 | 3/1986 | Peterson | 437/41 |
| 4,619,038 | 10/1986 | Pinkhouski | 437/193 |
| 4,651,408 | 3/1987 | MacElwee et al. | 437/89 |
| 4,784,971 | 11/1988 | Chiu et al. | 437/193 |

FOREIGN PATENT DOCUMENTS

| | | | |
|---|---|---|---|
| 0120570 | 6/1985 | Japan | 437/41 |
| 0063059 | 4/1986 | Japan | 437/41 |
| 0258476 | 11/1986 | Japan | 437/41 |
| 0117329 | 5/1987 | Japan | 437/228 |

OTHER PUBLICATIONS

S. S. Wong et al., "Elevated Source/Drain Mosfet", IEDM 1984, pp. 635-637.

Primary Examiner—Brian E. Hearn
Assistant Examiner—T. Thomas
Attorney, Agent, or Firm—John A. Fisher

[57] ABSTRACT

A process for the fabrication of elevated source/drain IGFET devices is disclosed. In accordance with one embodiment of the process, a silicon substrate is provided which is divided into active and field regions by a field oxide. A gate oxide is formed over the active region and a thin layer of polycrystalline silicon and a thick layer of silicon nitride are deposited on the gate oxide. The polycrystalline silicon and the silicon nitride are etched to form a stacked structure, with the spacers having substantially the same height as the stacked structure, in the pattern of the gate electrode. Sidewall spacers are formed on the edges of the stacked structure and the silicon nitride is removed. Polycrystalline silicon is then deposited onto the polycrystalline silicon and the exposed portions of the source and drain regions to complete the gate electrode and to form the source and drain electrodes. The selectively deposited polycrystalline silicon extends upwardly from the source and drain regions onto the field oxide. The sidewall spacers provide physical and electrical isolation between the gate electrode and the adjacent source and drain electrodes.

9 Claims, 3 Drawing Sheets

PROCESS FOR ELEVATED SOURCE/DRAIN FIELD EFFECT STRUCTURE

BACKGROUND OF THE INVENTION

This invention relates generally to a method for fabricating a semiconductor device, and more specifically to a method for its fabricating an elevated source/drain field effect transistor.

The present day semiconductor integrated circuits include many thousands of semiconductor devices interconnected on a single chip of semiconductor material. As the complexity of the function being integrated increases, more and more devices are packed onto that chip. Additionally, even as the device becomes more complex, the performance of that device often increases also. In order to accommodate the higher packing density and higher performance, each individual device must be reduced in size and particular attention must be paid to reducing parasitic capacitances. At the same time, it is imperative that the process used to fabricate the improved device be both manufacturable and highly reliable.

One device structure which can contribute to reducing both device size and parasitic capacitance is the elevated source/drain structure. In this structure, contact is made to the source and drain regions by a polycrystalline silicon electrode which extends from the source or drain regions themselves up onto the adjoining field insulator. The actual source or drain region can be made small and thus low in capacitance. Electrical contacts to the source and drains usually require the dedication of a relatively large area on the chip, but with the elevated source/drain structure, contact is made by contacting that portion of the polycrystalline silicon electrode which is positioned on the field insulator so that the active area of the device can be minimized.

Although the elevated source/drain structure is recognized as a structure which will achieve many of the proposed size and performance goals, there has not been a reliable and manufacturable process by which such devices can be fabricated.

It is therefore an object of this invention to provide an improved process for the fabrication of semiconductor devices.

It is another object of this invention to provide an improved process for the fabrication of elevated source/drain structures.

It is yet another object of this invention to provide an improved process for the fabrication of advanced submicron CMOS circuits.

BRIEF SUMMARY OF THE INVENTION

The foregoing and other objects and advantages of the invention are achieved through a process which results in elevated source and drain electrodes self-aligned with and spaced away from the gate electrode. In accordance with one embodiment of the invention, a silicon substrate is provided with field isolation dividing the substrate into active and field regions. A gate insulator is formed overlying the active region of the substrate and a first layer of polycrystalline silicon is deposited on that gate insulator. A thick layer of dielectric material is deposited on the first layer of polycrystalline silicon and the dielectric layer and polycrystalline silicon are patterned to form a stacked structure in the shape of the gate electrode pattern. A layer of spacer forming material is deposited on the stacked structure and anisotropically etched to form sidewall spacers at the sides of the stacked structure. The spacer forming material and any gate insulator are removed from the portions of the active regions adjacent the spacers. The patterned dielectric layer is then removed from the top of the stacked structure and a second layer of polycrystalline silicon is selectively deposited on both the patterned layer of polycrystalline silicon and on the exposed portions of the active device regions. The selectively deposited polycrystalline silicon deposits on the exposed silicon and extends laterally up onto the field isolation. The second layer of polycrystalline silicon is doped with a conductivity determining dopant which is, in turn, used to dope the contact areas of the source and drain structures. The sidewall spacers provide physical and electrical isolation between the elevated source/drain electrodes and the gate electrode.

DETAILED DESCRIPTION OF PREFERRED EMBODIMENTS

Figure 1:
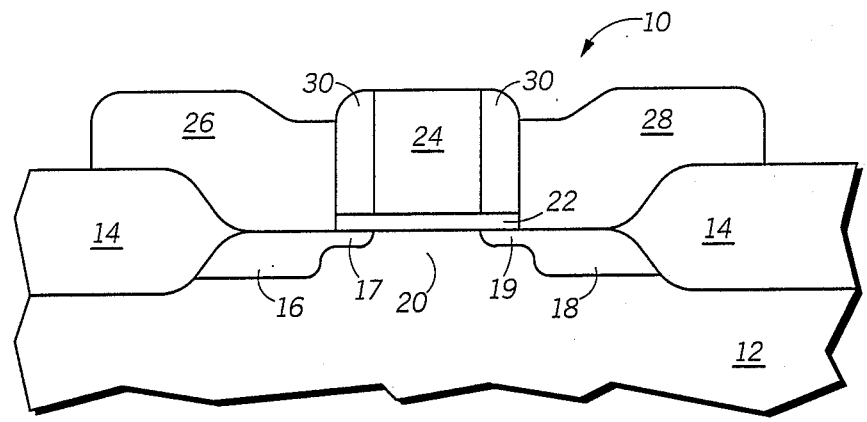
FIG. 1 illustrates, in cross-section, a semiconductor device in accordance with one embodiment of the invention.

FIG. 1 illustrates, in cross-section, a portion of a completed semiconductor device 10 manufactured in accordance with one embodiment of the invention. For purposes of illustrating the invention, device 10 is described as an N-channel insulated gate field effect transistor (IGFET), although the invention is equally applicable to a P-channel device. Device 10 includes a substrate 12 of P-type silicon material. A field insulator 14, such as a thick field oxide, provides electrical isolation between adjacent devices used in the integrated circuit. The source of device 10 includes a heavily doped portion 16 and a more lightly doped portion 17. Similarly, the drain of device 10 includes a heavily doped portion 18 and a more lightly doped portion 19. The source and drain regions are each doped N-type with N-type conductivity determining impurities such as arsenic or phosphorus. The source and drain structures illustrated, with a heavily doped portion and a lightly doped portion, are representative of the well known LDD structure. A channel region 20 of P-type material separates the source and drain regions. Overlying the channel is a gate insulator 22, preferably thermally grown silicon dioxide. In turn, overlying gate insulator 22 is a polycrystalline silicon gate electrode 24 which is heavily doped with conductivity determining impurities, usually N-type impurities for an N-channel IGFET. Contact to the source and drain regions is accomplished with polycrystalline silicon electrodes 26 and 28, respectively. Electrodes 26 and 28 provide electrical contact to the source and drain region and extend partially over the field isolation 14. The extension of the source and drain electrodes onto the field insulator gives rise to the name "elevated source/drain structure." An insulating spacer 30 separates the source and drain electrodes from the gate electrode 24.

The elevated source/drain structure in accordance with the invention has the advantages that the source and drain electrodes are separated from but closely spaced to the gate electrode. In addition, because a portion of the source and drain electrodes extend up onto the insulating field region, a minimum amount of active device region is required for contacting the source and drain regions. The net result is a device which is smaller in physical size and for which the source and drain regions themselves can be smaller and thus have lower junction capacitance.

Figure 2:
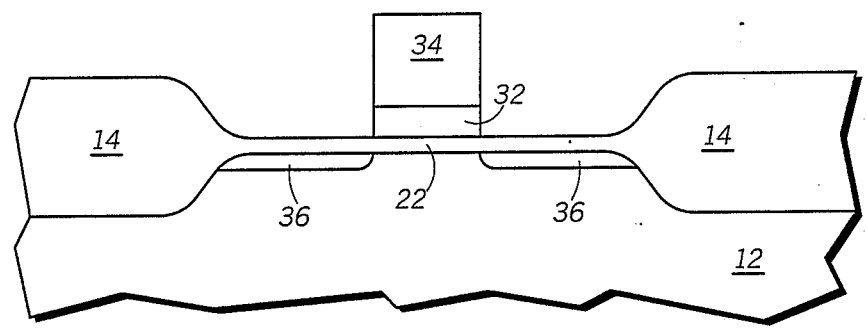
FIGS. 2–5 illustrates, in cross-section, process steps in accordance with one embodiment of the invention used to fabricate the device of FIG. 1.

FIGS. 2–5 illustrate, in cross-section, process steps in accordance with one embodiment of the invention by which device 10 is fabricated. As illustrated in FIG. 2, the fabrication of a device in accordance with the invention begins, in conventional manner, with a monocrystalline semiconductor substrate 12, P-type in this example, which is separated into active and field regions by thick field insulation 14. Thick field insulator 14 provide electrical isolation at the surface of substrate 12 to electrically isolate the device under construction from an adjacent device. Preferably, the thick field insulator is silicon dioxide which is at least partially recessed into the surface of substrate 12. The device being fabricated is constructed in the active area, that portion of the semiconductor substrate which is substantially surrounded by field insulator 14. A thin gate insulator 22 is formed on the surface of semiconductor substrate 12. Preferably the gate insulator is a thin layer of thermally grown silicon dioxide having a thickness of about 10–25 nanometers. Over the layer of gate insulator is deposited first a layer of polycrystalline silicon and then a thick layer of dielectric material. The combination of polycrystalline silicon and thick dielectric material are photolithographically patterned and etched to form a stacked structure including a thin layer of polycrystalline silicon 32 which is overlaid by a thick dielectric layer 34. The stacked structure is patterned in the shape of the eventual gate electrode of the device. Preferably, polycrystalline silicon layer 32 has a thickness of about 50 nanometers and is formed by the chemical vapor deposition of a layer of either doped or undoped polycrystalline silicon. The thick dielectric layer 34 can be a material such as silicon nitride and preferably has a thickness of about 250–500 nanometers. The thickness of dielectric layer 34 is determined by the thickness of a polycrystalline silicon layer which is to be deposited later in the process. Following the etching of the stacked structure, the photoresist used in patterning the dielectric material and polycrystalline silicon is removed.

As one alternative to the process, the device structure is ion implanted with conductivity determining ions prior to the deposition of the thick dielectric layer which covers the layer of polycrystalline silicon. This implantation is performed at an energy which causes the ions to penetrate both the thin layer of polycrystalline silicon and the gate insulator. This places the ions in the channel region of the semiconductor device beneath the eventual gate electrode and adjusts the threshold voltage of the device to the desired value.

Following the patterning of the stacked structure and the removal of the photoresist used to pattern that structure, arsenic or phosphorus ions are implanted into the substrate surface to form the lightly doped source and drain regions 36 which form the lightly doped portion of the LDD source and drain structure. This implantation is done using the stacked structure as an ion implantation mask.

Figure 3:
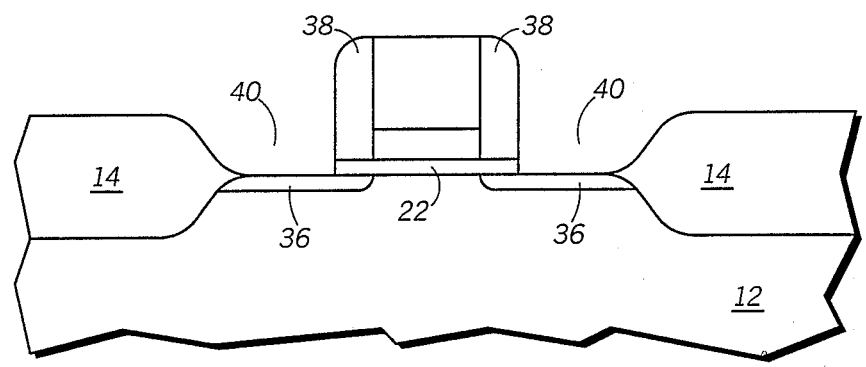

The process is continued, in accordance with the invention, by depositing a spacer forming material onto the partially completed device structure illustrated in FIG. 2. The spacer forming material is a dielectric material different from the thick dielectric material deposited as the top portion of the stacked structure. For example, if the previously deposited thick dielectric material is silicon nitride, the spacer forming material can be chemical vapor deposited low temperature oxide, TEOS oxide, plasma enhanced chemical vapor deposited oxide, or the like. If the previously deposited dielectric material was an oxide, the spacer forming material can be a material such as silicon nitride. The spacer forming material is anisotropically etched, such as by reactive ion etching, to form sidewall spacers 38 on the sides of the stacked structure. Additionally, either as part of the anisotropic etch or as a separate etching step, the portion of gate insulator 22 which was present over the source and drain regions and which is not protected by the stacked structure or by the sidewall spacers is removed to leave bare silicon over those exposed portions 40 of the source and drain regions as illustrated in FIG. 3.

Figure 4:
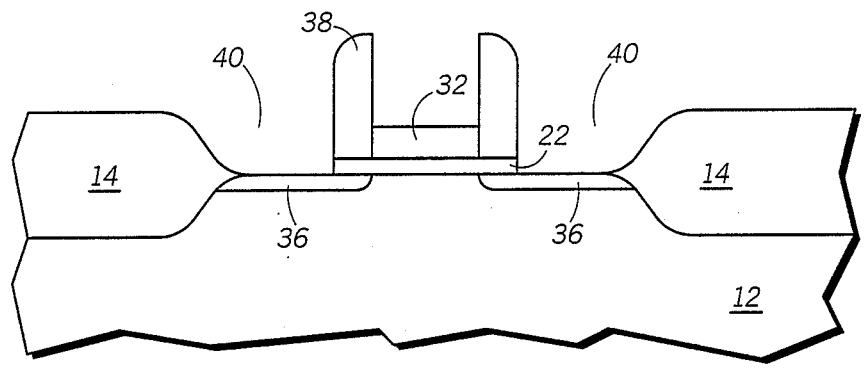

As illustrated in FIG. 4, the first dielectric material is then removed. If the first dielectric material is silicon nitride, for example, the nitride can be removed in a wet etchant such as hot phosphoric acid or in a dry plasma etchant which etches the nitride preferentially to the material forming the sidewall spacers. The removal of the silicon nitride leaves the sidewall spacers in place and extending upwardly from the gate insulator and the substrate surface.

Figure 5:
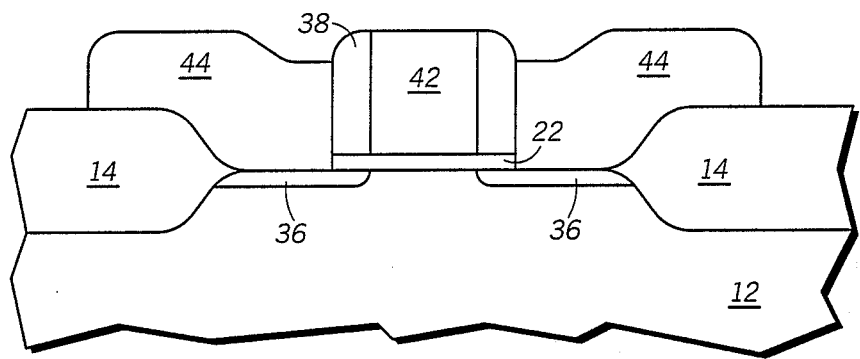

In accordance with the invention, polycrystalline silicon is selectively deposited on the exposed polycrystalline silicon 32 and on the bare exposed portions 40 of source and drain regions 36. The selective deposition of polycrystalline silicon results in the formation of polycrystalline silicon gate electrode 42 (which includes the originally formed polycrystalline silicon 32) and polycrystalline silicon electrodes 44 which contact the exposed portions of the source and drain regions 36. In the selective deposition process, the deposition reaction is adjusted so that the polycrystalline silicon is deposited only on exposed silicon, either polycrystalline or monocrystalline, which acts as a nucleating site for the deposition. The selectively deposited polycrystalline silicon deposits on both the exposed silicon substrate and on the exposed polycrystalline silicon 32. In addition, with continued deposition the selectively deposited polycrystalline silicon itself acts as a nucleating site so that additional polycrystalline silicon deposits on earlier deposits to extend the polycrystalline silicon upwardly onto the field isolation regions 14. The selectively deposited polycrystalline silicon does not otherwise deposit on oxides or other dielectric materials. The selectively deposited polycrystalline silicon is self-aligned to the source, drain, and gate regions because it deposits only on the exposed monocrystalline silicon in the source and drain regions and the polycrystalline silicon in the gate electrode region. The source and drain electrodes 44 are electrically separated from the gate electrode 42 by the remaining sidewall spacers 38 as illustrated in FIG. 5. The thickness of the earlier deposited thick dielectric layer which forms layer 34 in the stacked structure determines, to a first approximation, the height of the sidewall spacers. The height of the sidewall spacers must be at least equal to the thickness of the deposited polycrystalline silicon to insure the separation between the gate electrode and the adjacent source and drain electrodes. The thickness of the thick dielectric layer must, therefore, be adjusted to result in the necessary height for the sidewall spacers.

Preferably the polycrystalline silicon which is selectively deposited to form the source, drain, and gate electrodes is deposited as undoped polycrystalline silicon if a CMOS structure is being fabricated and is deposited N-doped if N-channel devices are being fabricated. If deposited undoped, for either the fabrication of NMOS devices or CMOS devices, the selectively deposited polycrystalline silicon can be subsequently doped by either ion implantation, thermal diffusion from a gaseous source or a spin-on dopant source, or the like. In the case of fabricating CMOS devices, the conductivity determining dopant can be applied selectively to dope selective portions of the polycrystalline silicon either N-type or P-type, as needed, by using a patterned layer of photoresist as an implantation mask. After the doping, the application of a thermal anneal causes the diffusion of some of the conductivity determining dopant from the polycrystalline silicon into the underlying monocrystalline silicon substrate to form the contact region 16, 18 illustrated in the completed device in FIG. 1. The contact regions 16, 18 are heavily doped to insure low contact resistance between the monocrystalline silicon substrate and the contacting electrode. The extensions of the source and drain regions 17, 19 remain lightly doped to reduce problems with hot carrier injection into the gate insulator.

Figure 6:
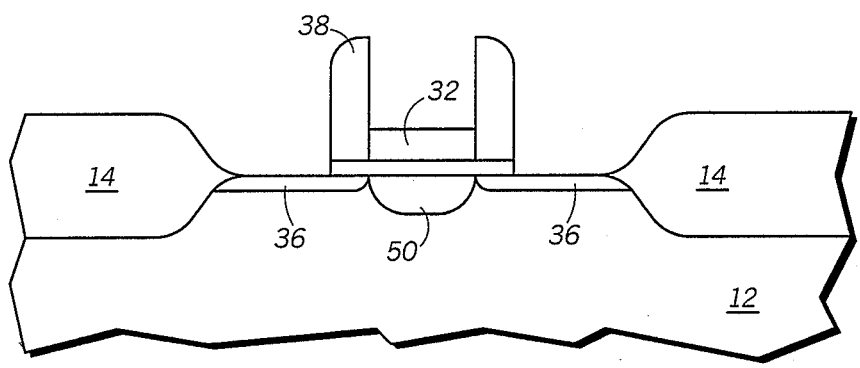
FIGS. 6 and 7 illustrate, in cross-section, further embodiments of the invention.
Figure 7:
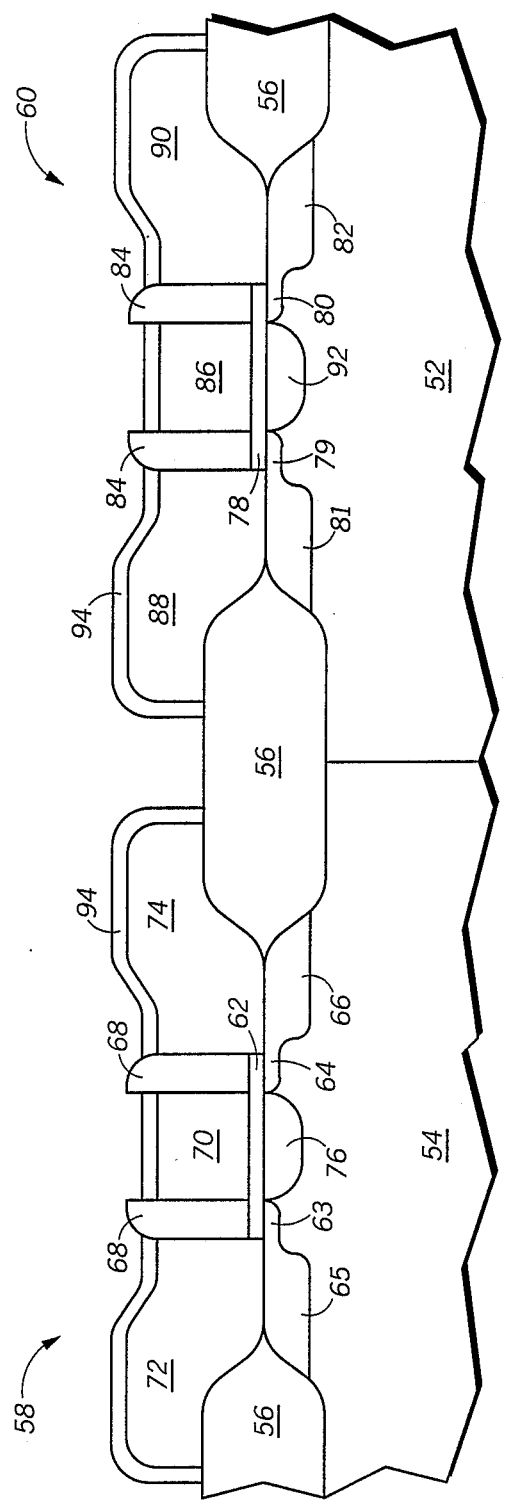

FIGS. 6 and 7 illustrate other embodiments and variations of the above-disclosed process in accordance with the invention. FIG. 6 illustrates an alternative to the above-described process which can be implemented immediately after the structure illustrated in FIG. 4 is achieved. In accordance with this embodiment of the invention, instead of performing the channel dopant adjusting implant before the deposition of the thick dielectric layer, the structure is ion implanted with conductivity determining ions to achieve the desired doping in the channel region of the IGFET after the first thick dielectric material is removed and before the selective deposition of polycrystalline silicon. This ion implantation, in the case of an N-channel device, preferably is an ion implantation of boron ions to raise the threshold voltage of the N-channel device to the desired level. The implantation is masked by sidewall spacers 38, resulting in a channel implanted region 50 which is self-aligned with lightly doped source and drain regions 36. This allows both the N-type implanted region 36 and the P-type implanted region 50 to be lower in doping concentration because the two implants do not appreciably overlap and thus do not need to allow for compensation. The lighter implants, in turn, result in improved resistance to hot carrier injection and to higher channel mobility.

FIG. 7 illustrates a further embodiment of the invention. In this embodiment a CMOS implementation is illustrated. The structure is fabricated on a monocrystalline silicon substrate having an N-type surface region 52 and a P-type surface region 54. Field oxide 56 provides electrical isolation between adjacent devices. An N-channel device 58 is formed in P-type surface region 54 and a P-channel device 60 is formed in N-type surface region 52. P-channel device 58 includes a gate insulator 62, a lightly doped source region 63, a lightly doped drain region 64, a heavily doped source region 65, and a heavily doped drain region 66. Sidewall spacers 68 provide physical and electrical isolation between a polycrystalline silicon gate electrode 70 and polycrystalline silicon source and drain electrodes 72, 74, respectively. The gate electrode and the source and drain electrodes are formed by the selective deposition of polycrystalline silicon in the manner explained above. Source and drain electrodes 72, 74 and gate electrode 70 are heavily doped with N-type conductivity determining impurities which have additionally been diffused into the underlying monocrystalline silicon substrate to form the heavily doped portions of the source and drain regions. An implanted channel region 76 is formed by the ion implantation of boron ions to establish the desired doping concentration in the channel region. Implanted channel region 76 is formed by ion implantation using sidewall spacers 68 as ion implantation masks so that region 70 is self-aligned with lightly doped regions 63 and 64.

P-channel transistor 60 includes a gate insulator 78, lightly doped source region 79, lightly doped drain region 80, heavily doped source region 81, and heavily doped drain region 82. Sidewall spacers 84 provide physical and electrical isolation between a polycrystalline silicon gate electrode 86 and polycrystalline silicon source and drain electrodes 88, 90, respectively. The polycrystalline silicon electrodes are formed by the selective deposition of polycrystalline silicon and are doped P-type. P-type doping from source and drain electrodes 88 and 90 is diffused into the underlying monocrystalline silicon substrate to form the heavily doped portions of the source and drain regions. An ion implanted channel region 92 is formed by the ion implantation of N-type conductivity determining ions into the channel region using the sidewall spacers as ion implantation masks.

In accordance with a further embodiment of the invention, a layer of metal silicide 94 is formed on the upper surface of the polycrystalline silicon electrodes. Metal silicide layer 94 is formed, for example, by the deposition of a metal such as titanium over the surface of the entire structure. A subsequent thermal anneal, for example, 60 seconds at 650° C., causes the formation of titanium disilicide where the titanium metal is in contact with the polycrystalline silicon. No silicide forms in those regions where titanium metal overlies an oxide or other dielectric material. The remaining titanium is removed by etching in ammonium hydroxide and hydrogen peroxide which removes the titanium metal but leaves the titanium disilicide unaffected. The silicide on the gate electrodes is physically and electrically separated from the silicide on the source and drain electrodes by the presence of the sidewall spacer 68, 84.

Thus it is apparent that there has been provided, in accordance with the invention, a process for the fabrication of self-aligned elevated source/drain structures which fully meets the objects and advantages set forth above. Although the invention has been described and illustrated with reference to specific embodiments thereof, it is not intended that the invention be limited to these illustrative examples. Those skilled in the art will recognize that variations and modifications can be made without departing from the spirit of the invention. For example, other dielectric materials may be used, as well as other methods of deposition of those materials. Also, different combinations of dopants can be used; for example, the threshold adjusting ion implantation step can be used to either raise or lower the threshold of desired devices. Additionally, other silicide forming metals besides titanium can be used such as tantalum, platinum, tungsten, and the like. It is intended to encompass within the invention all such variations and modifications as fall within the scope of the appended claims.

We claim:

1. A process for fabricating an insulated gate field effect transistor having elevated source and drain electrodes comprising the steps of:
    providing a silicon substrate of a first conductivity type;
    forming a field isolation dividing said substrate into active and field regions;
    forming a gate insulator overlying said active regions;
    depositing a first layer of polycrystalline silicon overlying said gate insulator;
    depositing a dielectric layer overlying said first layer of polycrystalline silicon;
    patterning said dielectric layer and said first layer of polycrystalline silicon to form a stacked structure having a patterned dielectric layer overlying a patterned layer of polycrystalline silicon in a gate electrode pattern;
    depositing a layer of spacer forming material overlying said stacked structure;
    anisotropically etching said layer of spacer forming material to form sidewall spacers at the sides of said stacked structure;
    exposing portions of said active regions adjacent said spacers;
    removing said patterned dielectric layer;
    selectively depositing a second layer of polycrystalline silicon on said patterned layer of polycrystalline silicon and on said exposed portions of said active regions; and doping said second layer of polycrystalline silicon with a first dopant.

2. The process of claim 1 further comprising, after said step of patterning said dielectric layer and said first polycrystalline silicon, the step of selectively doping said active regions with a second conductivity determining dopant of a second conductivity type and a first concentration.

3. The process of claim 2 further comprising the step of implanting conductivity determining dopant ions into said active regions after said step of depositing a first layer of polycrystalline silicon and before said step of depositing a dielectric layer to alter the threshold voltage of the insulated gate field effect transistor.

4. The process of claim 2 further comprising the step of implanting conductivity determining dopant ions into said active regions after said step of removing said patterned dielectric layer and before said step of selectively depositing to alter the threshold voltage of the insulated gate field effect transistor.

5. The process of claim 2 further comprising the step of thermally annealing said second layer of polycrystalline silicon to redistribute said first dopant therein and to drive said first dopant from said second layer into said active regions and wherein said first dopant is of second conductivity type and second concentration greater than said first concentration.

6. The process of claim 1 further comprising the step of thermally annealing said second layer of polycrystalline silicon to redistribute said first dopant therein and to drive said first dopant from said second layer into said active regions to form source and drain regions.

7. The process of claim 1 further comprising the step of forming a metal silicide contacting said second layer of polycrystalline silicon.

8. A process for fabricating a self aligned elevated source/drain field effect transistor comprising the steps of:
    providing a semiconductor substrate having a surface region of first conductivity type, said surface region separated into active areas and field areas by a thick field insulator which is at least partially recessed into said substrate;
    forming a gate insulator overlying said active areas;
    depositing a first layer of polycrystalline silicon overlying said gate insulator and a first dielectric layer overlying said first layer of polycrystalline silicon;
    etching said first dielectric layer and said first layer of polycrystalline silicon to form a composite structure having a gate electrode pattern;
    implanting conductivity determining ions of second conductivity type into said active areas using said composite structure as an ion implant mask to form source and drain regions self aligned with said gate electrode pattern;
    forming side wall spacers on the edges of said composite structure;
    removing said first dielectric layer and exposing a surface of said first layer of polycrystalline silicon and portions of said active areas not overlaid by said sidewall spacers;
    implanting conductivity determining ions into said active areas to adjust the conductivity of a channel area located between said source and drain regions using said sidewall spacers as an ion implant mask;
    selectively deposit second polycrystalline silicon on said exposed surface of said first layer of polycrystalline silicon and said portions of said active areas;
    conductivity doping said second polycrystalline silicon to form source, gate, and drain electrodes closely spaced and separated by said sidewall spacers; and
    diffusing conductivity determining dopant from said second polycrystalline silicon into said active areas to form contact regions in said source and drain regions, said contact regions having a higher dopant concentration that said source and drain regions and spaced from said channel area by said sidewall spacers.

9. A process for fabricating an insulated gate field effect transistor having elevated source and drain electrodes comprising the steps of:
    providing a silicon substrate of a first conductivity type;
    forming a field isolation dividing said substrate into active and field regions;
    forming a gate insulator overlying said active regions;
    depositing a first layer of polycrystalline silicon overlying said gate insulator;
    patterning said first layer of polycrystalline silicon;
    forming sidewall spacers at the edges of said patterned polycrystalline silicon, said spacers extending above said polycrystalline silicon;
    exposing a portion of said active regions adjacent said sidewall spacers;
    and selectively depositing a second layer of polycrystalline silicon on said first layer of polycrystalline silicon and on said exposed portion, said sidewall spacers providing physical and electrical isolation between said selectively deposited polycrystalline silicon on said first layer of polycrystalline silicon and that on said exposed portion.

* * * * *